United States Patent [19]

Scharrer et al.

[11] Patent Number: 4,815,038

[45] Date of Patent: Mar. 21, 1989

[54] MULTIPORT RAM MEMORY CELL

[75] Inventors: Carl J. Scharrer; Roland H. Pang, both of Plano, Tex.

[73] Assignee: Texas Instruments Incorporated, Dallas, Tex.

[21] Appl. No.: 45,981

[22] Filed: May 1, 1987

[51] Int. Cl.[4] .............................................. G11C 7/00
[52] U.S. Cl. ..................................... 365/189; 365/230
[58] Field of Search ........................ 365/189, 230, 233

[56] References Cited

U.S. PATENT DOCUMENTS 4,616,347 10/1986 Bernstein ............................ 365/230

Primary Examiner—Joseph A. Popek
Attorney, Agent, or Firm—Michael E. Melton; Mel Sharp; Rhys Merrett

[57] ABSTRACT

A multiport random access memory cell includes a current mode latch (68) for storing two logic states and interface circuits for interfacing the input of the latch (68) with multiple input ports and the output of the latch (68) with multiple output ports. The interface circuitry comprises current switches (70-76) for switching current to a current source in the presence of a write select and a row select signal to override the holding current in the current mode latch. The output interface circuitry includes current sensors (78-84) for sensing the logic state in the latch and outputting it to the select output ports in the presence of a row select signal. The current switches and the current sensors utilize current mode logic and with a common current source. The current source is disable in the absence of any row select signal such that power is not drawn by the memory cell in the unselected state.

31 Claims, 3 Drawing Sheets

MULTIPORT RAM MEMORY CELL

TECHNICAL FIELD OF THE INVENTION

The present invention pertains in general to random access memories and, more particularly, to a multi-port memory cell utilizing current mode logic technology.

BACKGROUND OF THE INVENTION

Random access memories (RAM) can be of the static type (SRAM) or of the dynamic type (DRAM). In the dynamic RAM, power is minimized by storing a charge on a capacitor and continually refreshing this charge. This charge determines the logic state stored in the capacitor memory cell. In a static type RAM, a logic bit is stored in a latch, and the state of the latch is maintained by continually drawing current through the latch. As the number of memory cells in the memory increases, this current also increases, as compared to the dynamic type RAM.

There are a number of technologies that have been utilized to realize an SRAM. Either MOS technology can be utilized in the form of CMOS, PMOS or NMOS or bipolar technology can be utilized. Utilizing MOS technology with field effect transistors, charge is typically stored on the gates of the transistors with an associated capacitance. This technology, although providing low power consumption, does have some disadvantages in that it is difficult to drive large capacitive loads with MOS transistors. Further, switching speeds are relatively slow as the MOS transistors have a non linear resistive driving characteristic. In bipolar technology, the transistors have higher transconductance, thus providing inherently faster operation due to the lower source impedance. One bipolar technology is emitter coupled logic (ECL) which is a current mode logic and provides very low voltage swings, the lowest speed-power product, and power consumption which is independant of operating frequency.

ECL logic gates and associated storage latches are formed by providing a current source which is selectively connected to various current paths through transistors configured as emitter followers. Current is switched between the various paths in response to a voltage applied to the base of select transistors. When realizing an SRAM in ECL technology, a latch is incorporated as a memory element in combination with Write logic gates to current switch the latch and current sensing gates to perform a Read function. Typically, each latch has one or a number of current sources associated therewith that maintain a static current at all times. The current requirements therefore increase as the number of memory elements increases. This can result in power dissipation as high as two to five watts for a single memory chip.

To accommodate the increasing density of ECL SRAMs, new package technologies have evolved to dissipate the heat. These new packages represent increased product cost at the silicon level which is compounded by cooling costs at the system level. There exists a need for technology that provides increased density without an increased power consumption.

SUMMARY OF THE INVENTION

The present invention disclosed and claimed herein comprises a multiport RAM cell. The cell includes a current mode latch for storing two logic states in the presence of a holding current. The latch is interfaced to multiple input ports through write circuitry and is operable to write data to the memory cell from the associated input port by overriding the holding current only when the memory cell is selected. Output read circuitry is associated with the latch to selectively output data to one or all of the plurality of output ports in response to a select signal selecting both the cell and the associated port.

In another embodiment of the present invention, the write circuitry includes current mode logic current switches which are operable to switch current in a constant current source to the latch to override the holding current in the presence of a port select signal and a write select signal for an associated port and cell. The read circuitry comprises a current mode logic current sensor for operating in conjunction with the constant current source to output a drive current to the associated output port. The current source is disabled when the associated port is deselected such that there is no power drain. In the write operation, the current switch is operable only in the presence of both a port and cell select signal and a write select signal. A write select signal is provided for a given port when both the port and cell select signal and an external write enable signal is present for that port.

In another embodiment of the present invention, the holding current is removed when a port and cell select signal for a given memory cell and a write enable signal for any of the ports in the memory cell are present. When the holding current is removed, the current provided by the write circuitry forces the current mode latch to a desired logic state. A holding current is provided by a single current source which is disposed on the periphery of an array of memory cells. The memory cells in one embodiment can be selected in entire rows with the cells in a given row having the holding current provided by a single current source with elements in the row being selected by signal row and port elect signal.

A technical advantage is provided by the present invention by including the interface circuitry for both the read and write operations adjacent the storage cell. This allows data lines from the multiple input and output ports to be input directly to the cell and the interface circuitry, such that only row/port select signals are required in order to read or write to the memory cells. A further technical advantage is provided by simultaneously reading from the output ports and writing to the input port for a given row/port select signal. This advantage is realized with the generation of a single write select signal in response to receiving both a row/port select signal and a write enable signal for a given port and cell. A further technical advantage is provided by selecting an entire row of memory elements with a single row and port select signal such that only one select signal is necessary for each port and each row of memory elements. Therefore, only one write select signal is required for each row of memory elements with the write select circuitry being disposed on the periphery of the memory array.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
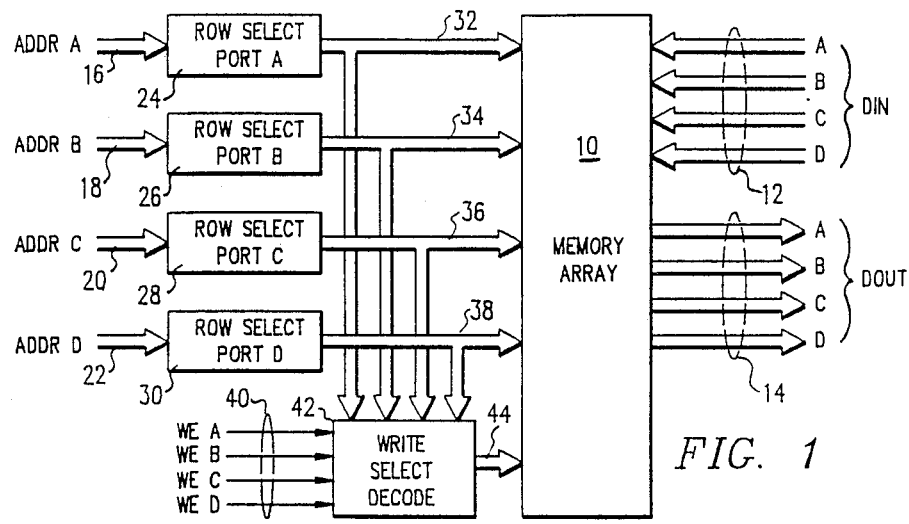
FIG. 1 illustrates a block diagram of the multiport memory.

Referring now to FIG. 1 there is illustrated a schematic block diagram of a multiport memory. The memory includes a memory array 10 which is comprised of a plurality of memory elements arranged in rows and columns. In the preferred embodiment, the memory elements in each row comprise a single word with each memory element in the row comprising a single logic bit of the word with multiple rows selectable for both reading and writing thereto. This is a random access memory array allowing selective access of any row in the memory array 10 for output therefrom on one of multiple output ports.

The memory array 10 is interfaced with four input data buses 12, each interfaced with a separate port A, B, C and D and comprises the data input DIN. The memory array 10 is also interfaced with four output data buses 14, each interfaced with an output port A, B, C, D and constituting the data output DOUT. Each of the input data buses 12 and the output data buses 14 is comprised of an eighteen bit wide data bus which corresponds to an eighteen bit wide data word. The memory array 10 is therefore arranged as an eighteen bit wide memory.

The memory of FIG. 1 has four input address buses 16, 18, 20 and 22 for receiving address inputs ADD A, ADD B, ADD C and ADD D. The address ADD A is a six-bit address which is input to a Row Select Port A decoder 24 which is a one of sixty-four decoder. In a similar manner, the addresses ADD B, ADD C and ADD D are each six-bit addresses which are input on the respective buses 18, 20 and 22 to decoders 26, 28 and 30. Each of the decoders 26-30 comprise a one of sixty four decoder. The decoder 24 is input into the memory array through a group of sixty four address lines 32 with decoders 26, 28 and 30 being similarly input into the memory array 10 through groups of address lines 34, 36 and 38. Each of the groups of address lines 32-38 are mutually exclusive such that only one address line in each of the groups 32-38 are selected at any one time. In accordance with one aspect of the present invention, four separate addresses can be received and four separate rows can be accessed in the memory array 10.

Write Enable signals are input to the memory on four Write Enable lines 40. The Write Enable signals are WE A, WE B, WE C and WE D, one associated with each of the ports A, B, C and D, respectively. The Write Enable lines 40 are input to a Write Select Decode circuit 42 which is also interfaced to the address lines 32-38. The Write Select Decode circuit 42 is operable to selectively determine whether the addressed memory elements are to have data written over the previously stored data. The Write Select Decode circuit 42 is interfaced with the memory array 10 through a group of Write Select lines 44.

In operation, the address ADD A determines which row in the memory array 10 is accessed for output on port A of the DOUT buses 14. If the Write Enable signal WE A on lines 40 is also activated, this allows data on port A of the DIN buses 12 to be written into the accessed row of memory elements. It is possible that all four addresses ADD A, ADD B, ADD C and ADD D are identical and select the same row for output on all four ports A, B, C and D of the DOUT buses 14. Although undesirable, it is possible to interface the data on the DIN buses 12 with an accessed row of memory elements. This normally would not occur.

Figure 2:
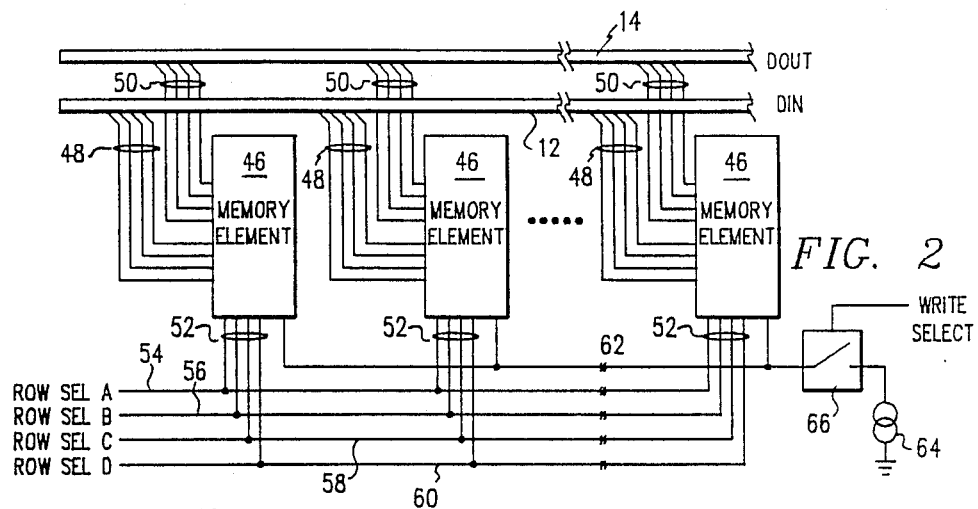
FIG. 2 illustrates a schematic diagram of one row of memory elements connected to the data buses and the row select signals.

Referring now to FIG. 2 there is illustrated a schematic block diagram of one row of memory elements. Each row is comprised of, in the preferred embodiment, eighteen memory elements 46. Each memory element 46 has the input thereof connected to the DIN data buses 12 through four separate data lines 48, one for each port A, B, C and D, the output thereof connected to the DOUT buses 14 through four separate data lines 50, one for each port A, B, C and D. Each of the separate data lines 48 and 50 represent a single bit of data. Each of the memory elements 46 has four row select input lines 52, each connected to one of the four row select lines 54, 56, 58 and 60 corresponding to ports A, B, C and D, respectively. In addition, each of the memory elements 46 has a holding current output connected to a line 62 which is switchably connected to a current source 64 through a switch 66. The switch 66 is connected to a Write Select signal.

In operation, each of the memory elements 46 in the accessed row is selected with the output thereof sensed and connected to the appropriate port of the DOUT buses 14. When a row select address selects a row of memory elements, it is selected for either port A, port B, port C or port D. The appropriate row select signal is applied to the selected one of the row select lines 54-60 such that the associated line for each of the memory elements 46 in the selected row is connected to the selected port A, B, C and D on the DOUT buses 14. If Write Enable signal associated with the selected port is also present on the Write Enable lines 40, a Write Select signal for the selected row is input to the switch 66 for that selected row. As will be described hereinbelow, the Write Select signal is operable to remove the holding current provided by the current source 64 from all of the memory elements in the selected row.

Figure 3:
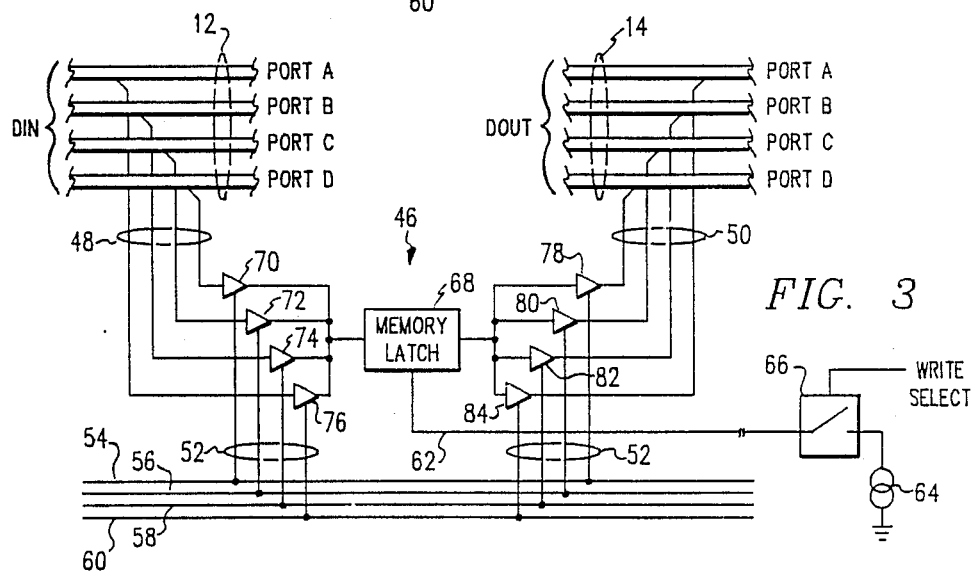
FIG. 3 illustrates a block diagram of one memory element.

Referring now to FIG. 3, there is illustrated a detailed schematic block diagram of each of the memory elements 46. Each of the memory elements 46 has a memory latch for storing a single bit of data. The memory latch 68, as will be described hereinbelow, utilizes current mode logic. The memory latch 68 is operable to store data in an static mode with a given holding current provided by current source 64. Data is read from the memory latch 68 current sensing logic and written to the latch with a current switch. Typically, the current required to write to the memory latch is many times the holding current. In the preferred embodiment, as will be described in more detail hereinbelow, the holding current is first removed by switch 66 for the entire row and then data input through a current switch to change the logic state of the memory latch 68. The holding current is then reapplied and the switching current removed. This reduces the amount of current required to write data into the memory latch 68. The input to the memory latch 68 is connected to the output of four data input buffers 70, 72, 74 and 76, each corresponding respectively to one of the ports A, B, C and D. The inputs of the data input buffers 70-76 are connected to one of the four lines 48, with each of the four lines 48 connected to one of the DIN buses 12 for ports A, B, C and D. Each of the data input buffers 70-76 has an Enable input connected to a respective one of the row select lines 54-60 with row select line 54 connected to the Enable input on input buffer 70, row select line 56 connected to the Enable input on buffer 72, select line 58 connected to the enable input on data input buffer 74 and row select line 60 connected to the Enable input of data input buffer 76.

The output of memory latch 68 is connected to four data out buffers 78, 80, 82 and 84. The outputs of output buffers 78-84 are connected to a different one of the lines 50 for interface with one of the ports A, B, C and D and the DOUT buses 14. In addition, each of the data out buffers 78-84 has an enable input connected to a select one of the row select lines 54-60. The enable input of output buffer 78 is connected to row select line 54, the enable input of output buffer 80 is connected to row select line 56, the enable input of output buffer 82 is connected to row select line 58 and the enable input of output buffer 84 is connected to row select line 60.

In operation, one of the row select lines 54-60 is activated such that the associated one of the input buffers 70-76 and the associated one of the output buffers 78-84 are simultaneously activated to both connect the input data on the appropriate port of the DIN bus 12 to the memory latch 68 and also to connect the output of memory latch 68 to the associated port on the DOUT buses 14. If information is to be written to the memory latch 68, the Write Select switch 66 is opened and the current source 64 removed. If information is not to be written into memory latch 68, the Write Select switch 66 is closed and current source 64 is connected to the memory latch 68 to maintain it in a static state, as will be described hereinbelow.

For a read operation, any number of the output buffers 78-84 can be enabled. However, if one of the Write Enable signals is present on Write Enable lines 40, the Write Select 66 will allow a Write operation. This would enable a corresponding number of the input buffers 70-76 on one memory cell which would give erroneous results. Therefore, reading of information in latch 68 to more than one port would not normally be associated with a Write operation from any of the input ports. In one aspect of the present invention, when an enable signal is not present for input to the buffers 70-76 or 78-84, no power is being drawn by these buffers. Since input gates in ECL technology normally require a constant current level for both a selected and a nonselected state, the power drain for an isolated or selected state would be the same.

With the use of the enabled input buffers of the present invention, a significant reduction in power drain is realized in the memory in addition to minimizing the incremental increase in power as memory elements are added. Current is only drawn when a row of memory elements is accessed other than the holding current of the latch 68.

Each memory element 46 has associated therewith the circuitry necessary to select one or more of the ports to read to and simultaneously write from one port and read to the same port. The memory element requires one row select for each port for either a read or a write operation and data lines from each of the input and output buses for each port. A single Write Select signal is required on the periphery of the memory array 10 to perform the Write operation.

Figure 4:
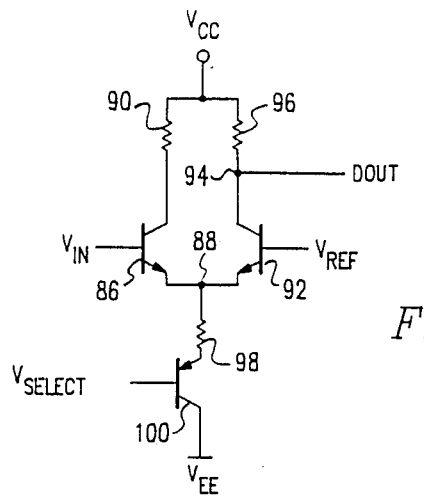
FIG. 4 illustrates a schematic diagram of a power down ECL gate.

Referring now to FIG. 4, there is illustrated a schematic diagram of a power down gate which is utilized for both input buffers 70-76 and the output buffers 78-84. The gate illustrated in FIG. 4 is representative of the output or Read buffers 78-84. An NPN transistor 86 has the emitter thereof connected to a node 88 and the collector thereof connected to one end of a resistor 90. The other end of the resistor 90 is connected to a supply terminal $V_{CC}$. A second NPN transistor 92 has the emitter thereof connected to the node 88 and the collector thereof connected to a node 94. A resistor 96 is connected between the node 94 and the supply voltage $V_{CC}$. The base of transistor 86 is connected to an input voltage $V_{IN}$ and the transistor 92 has a base thereof connected to a reference voltage $V_{REF}$. A resistor 98 has one end thereof connected to the node 88 and the other end thereof connected to the emitter of a PNP transistor 100. The transistor 100 has the collector thereof connected to a voltage $V_{EE}$ and the base thereof connected to a select voltage V SELECT.

In operation, the threshold voltage $V_{REF}$ provides a voltage that is less than the logic one state of the input voltage $V_{IN}$ but greater than the logic zero state. When $V_{IN}$ is in the low state, the transistor 92 conducts current to node 88. This results in node 94 being at a low voltage, which node comprises the DOUT terminal. When the voltage $V_{IN}$ is at a logic one or a high voltage, the base of transistor 86 is above the $V_{REF}$ and transistor 86 conducts, thus turning off transistor 92. The voltage on node 94 will then go high. This again requires the select on the base of transistor 100 to be at a low voltage.

When voltage is neither read out of the memory cell nor written into the memory cell, the voltage V SELECT on the base of transistor 100 is raised to a high voltage, thus turning off transistor 100. This results in no current flow through either transistor 86 or transistor 92. This is referred to as the "power-down" mode. The select signal corresponds to the row select signal output by the row select decoders.

Figure 5:
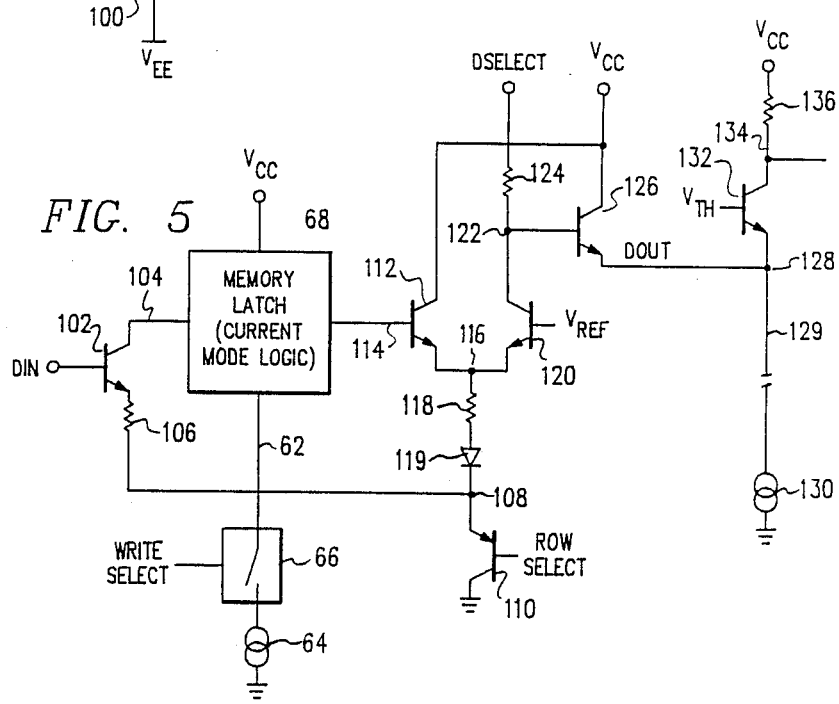
FIG. 5 illustrates a schematic diagram of the memory latch and the associated input and output buffers.

Referring now to FIG. 5, there is illustrated a detailed schematic diagram of one of the input buffers 70-76 and one of the output buffers 78-84 associated with the memory latch 68. This constitutes a single port. The memory latch 68 is realized in current mode logic and requires current switching to write data thereto and current sensing to read data therefrom. The input buffers 70-76 are each comprised of an NPN transistor 102 which has the collector thereof connected to an input line 104 on the memory latch 68. The transistor 102 has the base thereof connected to a select data line on one of the DIN buses 12 and the emitter thereof connected to one end of a resistor 106. The other end of the resistor 106 is connected to a node 108. The node 108 is similar to the node 88 in FIG. 4. A PNP transistor 110 has the emitter thereof connected between node 108 and the voltage $V_{EE}$. The collector thereof connected to the voltage $V_{EE}$. The base thereof is connected to a row select signal. Transistor 110 is similar in operation to transistor 100 in FIG. 4. In operation, a low voltage on the base of transistor 110 pulls node 108 to $V_{EE}$ and allows current to be conducted through transistor 102 if the voltage on $D_{IN}$ is a high voltage. When $D_{IN}$ is a high voltage, current will be pulled from the memory latch 68 through the input line 104 and when the voltage $D_{IN}$ is low, transistor 102 will not conduct. Transistor 102 provides in part the Write function.

To perform a Write function, transistor 102 pulls current from line 104 on the input to memory latch 68. Memory latch 68 is a current mode logic latch which requires a holding current to maintain a static state. In order to write new data into the memory latch 68 and change the state thereof, this holding current must be overridden. Typically, the write current is many times the holding current. To reduce the magnitude of the write current required to change the state of the memory latch 68, the holding current is removed by the Write Select switch 66 with current source 64 providing the holding current. After the logic state is changed, switch 66 closes and then the row select can be removed. To remove the holding current for an entire row, only a single write select switch 66 and a single current source 64 is needed per row and these can be located on the periphery of the memory array 10.

An NPN transistor 112 has a base thereof connected to an output line 114 from the memory latch 68, the collector thereof connected to $V_{CC}$ and the emitter thereof connected to a node 116. A resistor 118 is connected between the node 116 and the anode of a diode 120. The cathode of diode 120 is connected to node 108. The transistor 112 is similar in operation to the transistor 86 of FIG. 4. A second NPN transistor 120 has the base thereof connected to a voltage $V_{REF}$, the emitter thereof connected to the node 116 and the collector thereof connected to a node 122. A resistor 124 is connected between the node 122 and a Deselect signal. An output driver transistor 126 has the base thereof connected to node 122, the collector thereof connected to $V_{CC}$ and the emitter thereof connected to a DOUT terminal on node 128. Node 128 is connected to a line 129. The base of transistor 120 is connected to a voltage $V_{REF}$. The transistor 120 is similar in operation to transistor 92 of FIG. 4.

In operation, transistors 112 and 120 provide the Read function of the output buffers 78–84. When transistor 110 conducts, current is drawn through node 116 through either transistor 112 or 120, depending upon the relationship of the voltage on output line 114, and the level of the $V_{REF}$. When the voltage level on line 114 is above the $V_{REF}$, current is conducted through transistor 112 and the voltage on node 122 is high. When the voltage on line 114 is low, the opposite occurs, with current being conducted through transistor 120 and the voltage on node 122 being low. Transistor 126 is an emitter follower and drives node 128. Node 128 is connected to one end of a current source 130, the other end of which is connected to $V_{EE}$. The current source 130 is part of a sense amp, the other portion being comprised of a transistor 132 which has an emitter thereof connected to the line 129, the collector thereof is connected to one of the output buses on a node 134 and the base thereof connected to a threshold $V_{TH}$. A resistor 136 is connected between node 134 and $V_{CC}$. Each of the memory cells in a given column have the corresponding output transistor 126 connected to the line 129. This provides a "Wire OR" function. Since only one row is selected, only one output transistor 126 will provide current to the line 129 and the current source 130. If current is supplied through transistor 126, transistor 132 does not conduct. If transistor 126 does not provide current to node 128, transistor 132 conducts the current through the resistor 136 which current is sensed, thus providing the sensing function. With the system of the present invention, it can be seen that any number of ports can be connected to the input line 104 since writing to the current mode logic memory latch 68 requires only a change in current. In addition, any number of output read buffers can be connected to line 114, depending upon the drive characteristics required.

Figure 6:
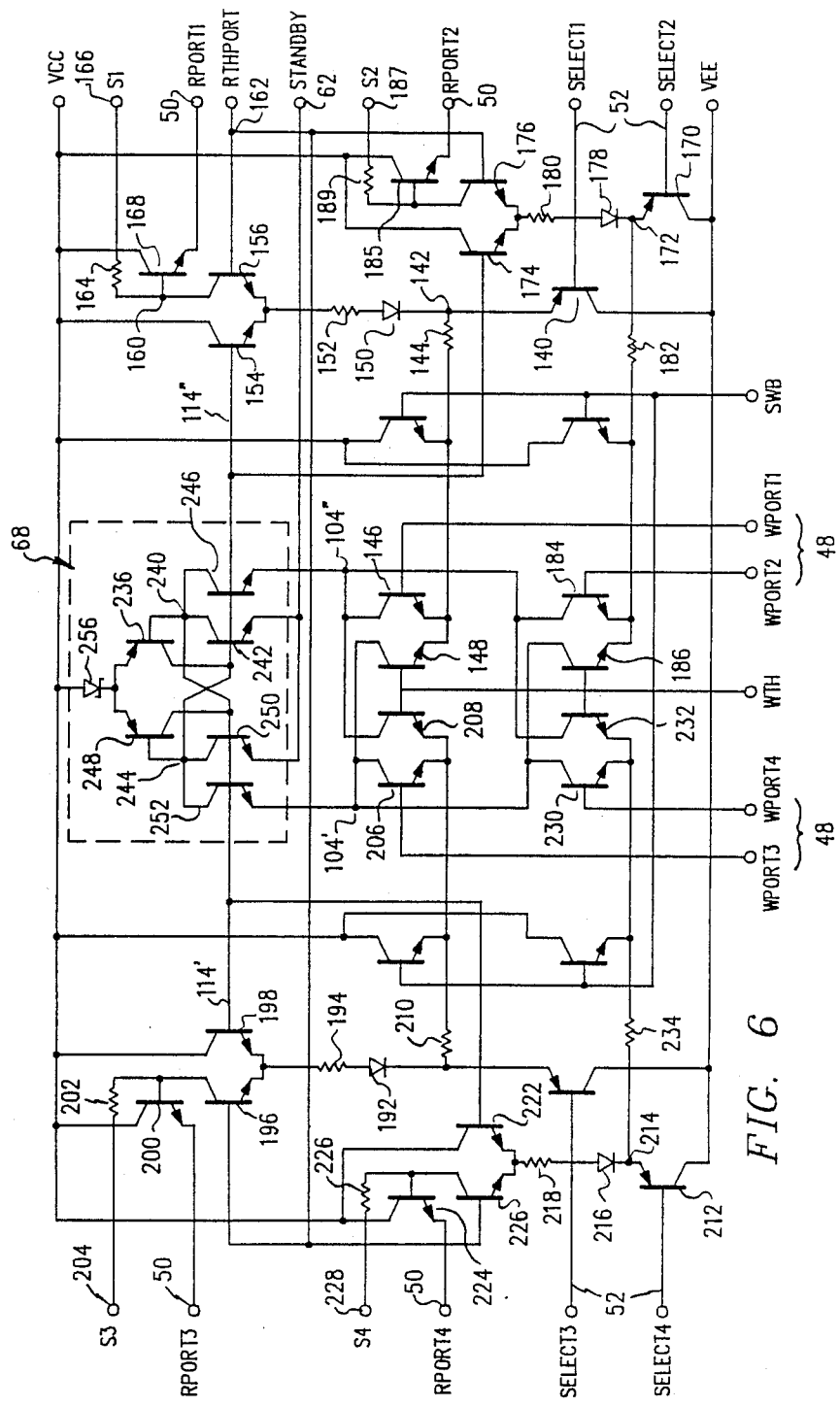
FIG. 6 illustrates a detailed schematic of the current mode latch with the multiport input and output buffers.

Referring now to FIG. 6, there is illustrated a schematic diagram of the memory latch 68 and the input and output buffers 70–84. There are four select signals SELECT 1, 2, 3 and 4, four DATA IN lines connected to the data buses 12 and labeled WPORT 1, 2, 3 and 4 and four output ports connected to the data out buses 14 and labeled RPORT 1, 2, 3 and 4. On Port 1, the SELECT 1 signal on the data lines 52 is connected to the base of the PNP transistor 140, the collector of which is connected to $V_{EE}$ and the emitter of which is connected to a node 142. The node 142 is connected through a resistor 144 to the emitter of an NPN transistor 146 and an NPN transistor 148. The collector of transistor 146 is connected to the input line 104 of the memory latch 68. The memory latch 68 provides two outputs and has two inputs. The inputs are labeled 104' and 104" and the outputs are labeled 114' and 114". The collector of transistor 146 is connected to output line 104" and the collector of transistor 148 is connected to the output 104'. The transistor 148 has the base thereof connected to a threshold voltage WTH. Node 142 is also connected to the cathode of a diode 150, the anode of which is connected to one end of a resistor 152. The other end of resistor 152 is connected to the emitters of an NPN transistor 154 and an NPN transistor 156. Transistor 154 has the collector thereof connected to $V_{CC}$ and the base thereof connected to output line 114". Transistor 156 has the collector thereof connected to a node 160 and the base thereof connected to a reference voltage level RTHPORT on a reference node 162. Node 160 is connected through a resistor 164 to a control node 166. Node 160 is also connected to the base of an NPN transistor 168, the collector of which is connected to $V_{CC}$ and the emitter of which is connected to the output data line 54 for port A. Transistor 140 operates similar to the transistor 100 of FIG. 4 and transistor 154 operates similar to transistor 86 of FIG. 4. Transistor 156 operates similar to transistor 92 of FIG. 4. Transistor 154 provides the Read function, with transistor 140 providing the switching function or power-down function. Transistor 146 and Transistor 148 operate in conjunction to form a gate for a Write function. They operate by sinking current from line 104".

Line 52 labeled SELECT 2 is connected to the base of a PNP transistor 170, the collector of which is connected to $V_{EE}$ and the emitter of which is connected to a node 172. Node 172 is connected to the emitters of NPN transistors 174 and 176 through diode 178 and resistor 180 which are configured similar to diode 150 and resistor 152. Node 172 is also connected through resistor 182 to the emitters of NPN transistors 184 and 186. Transistors 184 and 186 are configured identical to transistors 146 and 148 and operate in a similar manner. Transistor 174 operates similar to transistor 154 and an emitter follower output transistor 185 has the base thereof connected to the collector of transistor 176, which transistor 176 also has the collector thereof connected to a control node 187 through a resistor 189. Transistor 185 operates similar to transistor 168 and transistor 176 operates similar to transistor 156.

The row select for port C has a SELECT 3 signal connected to the base of a PNP transistor 188, the collector f which is connected to $V_{EE}$ and the emitter of which is connected to a node 190. Node 190 is connected through a series connected diode 192 and a resistor 194 to the emitter of an NPN transistor 196 and the emitter of an NPN transistor 198. Transistor 198 has the base thereof connected to output line 114' and the collector thereof connected to $V_{EE}$. Transistor 196 has the base thereof connected to reference node 161 and the collector thereof connected to the base of an emitter follower drive transistor 200 and also through a resistor 202 to a control node 204. Transistor 196 operates similar to transistor 156 with transistor 200 operating similar to transistor 168 for port C. Node 190 is also connected to the emitters of an NPN transistor of 206 and an NPN transistor of 208 through a resistor 210 with the base of transistor 206 being connected to the Write signal WPORT 3 and the collector thereof connected to input line 104'. Transistor 208 has the base thereof connected to the reference voltage WTH and the collector thereof connected input line 104". Transistor 206 operates similar to transistors 146 and 184 and transistor 208 operates similar to transistors 148 and 186.

For the row select signal of port D, the SELECT 4 signal is input to the base of a PNP transistor 212, the collector thereof which is connected to $V_{EE}$ and the emitter thereof which is connected to a node 214. Node 214 is connected through a series connected diode 216 and a resistor 218 to emitters of NPN transistors 220 and 222. Transistor 222 is connected similar to transistor 198, and transistor 220 is configured similar to transistor 196 with an emitter follower transistor 224 having the base thereof connected to the collector of transistor 220. The collector of transistor 220 is also connected through a resistor 226 to a reference node 228. Node 214 is also connected to the emitters of NPN transistors 230 and 232 through a resistor 234, transistors 230 and 232 operating similar to transistors 206 and 208 for the Write operation.

The operation of each of the gates is described with reference to FIG. 5. However, in the Read operation the output of the emitter follower transistors 168, 185, 200 and 224 have the base thereof connected through select resistors 164, 189, 202 and 226, respectively, to respective control nodes 166, 187, 204 and 228. Although the control nodes could be connected to $V_{CC}$, they are connected to a voltage that is offset from the SELECT 1, 2, 3 and 4 signals.

The memory latch 68, which utilizes current mode logic is comprised of two cross coupled Silicon Controlled Rectifiers (SCRs). The first SCR is comprised of a PNP transistor 236, the emitter of which is connected to a node 238 and the base thereof connected to a node 240. The first SCR has an NPN transistor 242 which has the base thereof connected to a node 244, the collector thereof connected to node 240 and the emitter thereof connected to the holding current line 62. Node 244 also comprises the output line 114". In addition to the NPN transistor 242, a parallel NPN transistor 246 is provided having the base thereof connected to node 244, the collector thereof connected to node 240 and the emitter thereof connected to the node 104". The second of the cross coupled SCRs is comprised of a PNP transistor 248 having the emitter thereof connected to node 238, the collector thereof connected to node 240 and the base thereof connected to node 244. An NPN transistor 250 has the base thereof connected to node 240, the collector thereof connected to node 244 and the emitter thereof connected to holding current line 62. A second NPN transistor in parallel with transistor 250 has the collector thereof connected to node 244, the base thereof connected to node 240 and the
emitter thereof connected to input line 104'.

In operation, the current mode latch 68 sinks current to current source 64 (not shown) when switch 66 (not shown) is closed, such that current is being conducted through either transistor 242 or 250 when it is latched. If, for example, node 244 is high, current will be conducted through transistor 242 and node 240 will be low, thus maintaining transistor 250 off. Transistor 256 will conduct, drawing current from node 238. Node 238 is connected to $V_{CC}$ through a diode 256. This state will be maintained regardless of the current load on lines 104' and 104". To provide a Read operation, node 244, which is common with node 114', has the voltage thereof impressed on the respective input transistors 154 and 174 of the output buffers for port A and port B, and node 240, which is node 114', has the voltage thereof input to transistors 198 and 222 for the output buffers of ports C and D. For a Write operation, it is only necessary to remove the current source from line 62 such that current is no longer being conducted through either transistor 242 or transistor 250. Thereafter, either node 104' or 104" is connected to a current sink and current pulled through either transistor 252 or transistor 246. This lowers the voltage at either node 244 or node 240, turning on the associated PNP transistors 248 or 236. For example, if current is pulled through transistor 252, node 244 is pulled low and transistor 242 is rendered nonconducting. Switch 66 is then closed and holding current is pulled through line 62 and transistor 250 conducts and transistor 242 does not conduct. This provides a latched state and a very low holding current cross coupled SCR latch.

Figure 7:
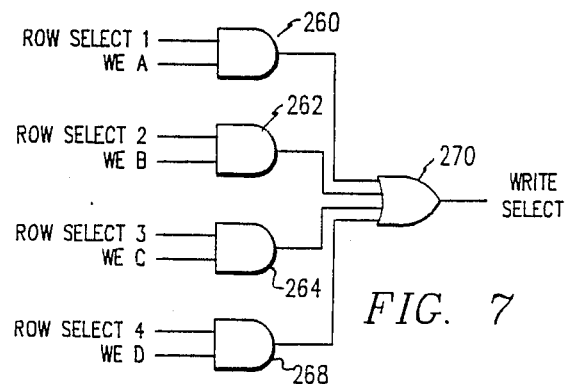
FIG. 7 illustrates a logic diagram for the write select logic.

Referring now to FIG. 7, there is illustrated a schematic diagram of the Write Select logic for one row. Each of the row select signals SELECT 1, 2, 3 and 4 are respectively connected to an input of AND gates 260, 262, 264 and 268. The other input of each of the AND gates 260–268 is connected to the Write Enable signals WE A, WE B, WE C and WE D, respectively. The outputs of AND gates 260–268 are each connected to one input of a four input OR gate 270. The output of OR gate 270 provides the Write Select function for the selected row. For a given row, the row select signal is ANDed with the Write Enable signal. When both signals are present, this provides an output on the respective one of the AND gates 260–268 and the Write Select signal is generated on the output of the OR gate 270. It can be seen from this logic that if more than two Rows Select signals are present and any of the associated Write Enable signals, this will provide a Write Select signal. This will be a disadvantage in that data from two DATA IN buses 12 would be connected to a given memory element. Therefore, it would be desirable not to have a Write Enable signal present when data is being read from a given memory element to two or more separate output ports.

In summary, there has been provided a multiport RAM memory cell with input and output data buffers that provide for low current operation. The input and output buffers draw current only when the memory element is selected and are idle otherwise. Multiport capability is provided by utilizing a current mode logic memory latch which is written to by selectively sinking current in response to one of a plurality of input signals. Each row of memory elements is connected to a single Write Enable signal to allow the system to Write the entire row in a single operation to provide the operation of a register latch. Each memory cell requires only row select signals and data input and output lines to function.

Although the preferred embodiment has been described in detail, it should be understood that various changes, substitutions and alterations can be made therein without departing from the spirit and scope of the invention as defined by the appended claims.

What is claimed is:

1. A memory cell for being disposed in an array of like memory cells in a multiport random access memory and selectively interfaced with data lines for a plurality of input and output data ports, and a port/cell select signal for selecting both the memory cell and the port that the memory cell is to be interfaced to, the memory cell comprising:
   a current mode latch for storing two logic states in response to the presence of a holding current, the stored logic state alterable by overriding the holding current;
   a first current source operable to be connected to said current mode latch for providing said holding current;
   current switch circuitry associated with an input data line in each of the input ports, said current switch circuitry operable to override the holding current of said latch when a port/cell select signal and a Write Enable signal for the associated one of the input ports is present to alter the data in said latch; and
   current sense circuitry associated with an output data line in each of the output data ports, said current sense circuitry operable to sense the stored data in said latch for output on the select output data line in the associated output data port when a port/cell select signal for the associated output port is present.

2. The memory cell of claim 1 wherein said current mode latch comprises a cross coupled silicon control rectifier latch.

3. The memory cell of claim 1 and further comprising:
   removing switch circuitry for removing said holding current provided by said first current source from said current mold latch in the presence of a Write Enable signal for any of said ports.

4. The memory cell of claim 1 wherein said current switch circuit comprises a current switch and second current source, said current switch operable to be selectively connected between said current mode latch and said second current source with the current provided by said second current source sufficient to override the holding current in said current mold latch to write data to said current mode latch from an associated one of the select input data lines on the associated one of the select input data lines on the associated input port in the presence of a Write Enable signal and an associated port/cell select signal.

5. The memory cell of claim 4 and further comprising means to inhibit operation of said current source associated with said current switch in the absence of an associated port/cell select signal.

6. The memory cell of claim 1 wherein said current switch circuitry associated with a select input data line of each of the input ports comprises a third current source and a current sense circuit for sensing current to said third current source, the current conducted through said current sense circuit being a function of the logic state in said latch.

7. The memory cell of claim 6 and further comprising means to inhibit operation of said first current source in the absence of a port/cell select signal for the associated input port.

8. The memory cell of claim 1 and further comprising a port/cell current source associated with each port/cell select signal, said port/cell current source operable to source current only in the presence of the associated port/cell select signal wherein said current switch circuitry for each of said input ports comprises a current switch for switching current to said port/cell current source when a Write Enable signal is present for nay of said ports and said current sense circuitry comprises a current sensor for sensing current to said current sensor, the current conducted through said current sensor being a function of the logic state stored in said latch.

9. A memory cell for a multiport ram, comprising
   port interface circuitry for interfacing with a plurality of ports in the random access memory and having a plurality of input and output data lines, said port interface circuitry interfacing one input and one output data line for each port to the memory cell;
   cell select circuitry for receiving a port/cell select signal associated with each port when both the cell and the associated port are selected;
   a current mode latch for storing two logic states in the presence of a holding current, the stored logic state alterable by overriding the holding current;
   current source circuitry operable to provide a source of current for the cell;
   a current switch circuit associated with each interfaced input data line for receiving data therefrom and operable to switch said source of current in said current source circuitry to said current mode latch to override said holding current in response to receiving an associated port/cell select signal and a Write Enable signal and storing the received data in said current mode latch; and
   a current sense circuit associated with each interfaced output data line for operating in conjunction with said current source circuitry to sense the logic state in said current mode latch and output a drive current to said associated output data line in response to receiving an associated port/cell select signal.

10. The memory cell of claim 9 wherein said current source circuitry comprises a switchable current source associated with each port and operable in a first switch position to selectively provide a source of current for each port in response to receiving said port/cell select singles and operable in a second switch position such that no current is sourced when the memory cell is not selected.

11. The memory cell of claim 9 wherein said source of current provided by aid current source circuitry is inhibited when the cell is not selected.

12. The memory cell of claim 9 wherein each of said current switches comprises:
   a first transistor for providing a first current path connectable between a current supply and said source of current in said current source circuitry;

a second transistor providing a second current path between said current mode latch and said source of current in said current source circuitry; and control circuitry for selectably connecting said second current path in said second transistor to said current mode latch when an associated port/cell select signal is present; and current control circuitry for reducing said holding current when a Write Enable signal and a port/cell select signal for the memory cell is present such that the holding current is reduced below a predetermined level at which the current provided through the second path in said second transistor is operable to determine the logic state in said current mode latch.

13. The memory cell of claim 12 wherein said holding current is removed by said current control circuitry when a Write enable and a port/cell select signal is present for the associated cell.

14. The memory cell of claim 9 wherein said current sense circuit comprises:

a first transistor for providing a first current path between a supply voltage and said current source circuitry;

a second transistor for providing a second current path between the supply voltage and said current source circuitry;

a current sense element for being disposed in series with at least one circuit path to sense the current therethrough;

a current drive transistor for providing a current drive to said associated data output line;

control circuitry for controlling said first and second transistors to pass current through said first path for one logic state in said current mode latch and through said second path for a second logic state in said current mode latch; and inhibit circuitry for inhibiting current flow through said first and second paths in the absence of an associated port/cell select signal.

15. A selectable memory cell for a multiport random access memory, comprising a current mode latch for storing two logic states in the presence of a holding current, the stored logic state alterable by overriding the holding current by a predetermined current;

a holding current source for providing the holding current to said current ode latch;

input circuitry for interfacing with a plurality of input ports in the memory for receiving data therefrom and selectively writing the received data to the current mode latch by overriding the holding current;

output circuitry for interfacing with a plurality of output ports on the memory, said output ports each associated with one of the input ports, said output circuitry selectively sensing stored data in said current mode latch for output to the output ports;

select circuitry for receiving a port select signal for each port in the random access memory to both select the port to be output to or receive data from and select the cell, said port signal active when a port in the memory cell is selected for either writing to the current mode latch or sensing stored data therein, said select circuitry in the active state enabling said output circuit to output data; and write circuitry for receiving a write select signal and controlling said input circuitry to write data to the selected input ports when the write select signal is present and said port select signal in said select circuitry is active.

16. The memory cell of claim 15 wherein said current mode latch comprises a cross coupled silicon controlled rectifier latch.

17. The memory cell of claim 15 wherein said input circuitry is comprised of:

a plurality of current switches each associated with a separate one of the input ports of the memory;

a plurality of current sources each for being connected to one of said current switches, and operable in response to data on the associated input port to connect said current source to said current mode latch to override the holding current by said predetermined current; and inhibit circuitry for preventing current from flowing in said current sources in the absence of an associated port select signal such that current is not drawn unless said port associated therewith is selected by said port selected signal from said select circuitry.

18. The memory cell of claim 17 wherein said write circuitry comprises means for reducing the holding current such that the current provided by said current source associated with the selected one of said current switches exceeds the holding current by said predetermined current.

19. The memory cell of claim 17 wherein said write circuitry comprises circuitry for removing said holding current source from said current mode latch to remove said holding current such that said current source associated with the selected one of said current switches can be minimized to alter the logic state in said current mode latch.

20. The memory cell of claim 15 wherein said output circuitry comprises:

a plurality of current sense circuits;

a select current source associated with each of said current sense circuits for providing a constant current for said current sense circuits; and control circuitry for enabling said select current source in response to the presence of an active port select signal from said select circuitry for the associated port;

said current sense circuits operable to provide an output drive current as a function of the logic state stored in said current mode latch.

21. An multiport memory, comprising:

a plurality of input/output ports, each port having an input data bus and an output data bus;

address circuitry for receiving and decoding port select addresses associated with each port and each defining a memory location for an associated port and outputting a memory location select signal for the associated port;

write enable circuitry for receiving an external write enable signal for each port and outputting a write select signal when a memory location select signal for a particular memory location associated with a port and a write enable signal for the associated port are present, a write select signal associated with each memory location;

a plurality of memory cells arranged in rows and columns for storing data, a number of columns in a given row defining a word and a word defining a memory location;

write buffers associated with each memory cell, for interfacing between one of said input ports in said memory cell for inputting data from said input port to said memory cell and selectable by said memory location select signal output by said address circuitry for the associated port;

write inhibit circuitry for preventing data from being input to said memory cell by said write buffers to change the state thereof unless said write buffers are selected and a write select signal is present for the associated memory cell; and read buffers associated with each memory cell, said read buffers each associated with a separate one of said output ports for sensing data store in said associate memory cell in response to receiving a memory location select signal for the associated cell and associated port from said address circuitry.

22. The multiport memory of claim 21 wherein each of said memory cells comprises a current mode latch for storing two logic states in the presence of a holding current, the stored logic state alterable by overriding the holding current.

23. The multiport memory of claim 22 wherein said write buffer for an associated cell and one of said input ports comprises:
a current switch for being connected to the input of said memory cell;
a switchable current source for being connected to said current switch in the presence of as memory element select signal for the associated port;
said current switch operable to switch said current source for connecting said current mode latch to override the holding current therein when said write inhibit circuitry does not inhibit writing to said memory cell.

24. The memory cell of claim 23 wherein said write inhibit circuitry comprises:
a holding current source for providing holding current to said current mode latch; and
switch circuitry operable to selectably connect said holding current source to said current mode latch to provide the holding current, said switching circuitry disconnecting said holding current source when the associated cell is selected and the associated write select signal is present.

25. The multiport memory of claim 23 wherein each of said read buffers comprises:
a current sensor for providing a switched current path between a supply and said current source in said write buffer, said current sensor having a first and a second current path and switching between said first and second current path as a function of the data stored in said current mode latch, current in said second path determining the logic state for output therefrom;
sensing circuitry for sensing current in said second path and outputting a two state voltage as a function of the presence or absence of current in said second path to said output port.

26. The multiport memory of claim 21 wherein said select addresses are row addresses for selecting an entire row of said memory cells and all said write buffers and said read buffers for associated ports are commonly selected.

27. The multiport memory of claim 26 wherein said write inhibit circuitry is disposed on the periphery of the rows and columns of memory cells and is common to said memory cells in each of said rows such that a select signal for each of said rows and a write enable signal associated with any of said ports selected by said memory location select signal allows writing of data to all of said memory cells in a selected row.

28. A method for selectively interfacing a memory element with input and output data lines for a plurality of input and output data ports and a port/cell select signal, the port/cell select signal for selecting both the memory element and the port that the memory element is to be interfaced to for accessing information therefrom or outputting information thereto, comprising:
providing a current mode latch for storing two logic states in response to the presence of a holding current, the stored logic state alterable by overriding the holding current;
selectively overriding the holding current when a port/cell select signal and a write enable signal for one of the input ports is present such that the logic state in the latch is altered in accordance with data on the associated one of the input ports; and
sensing the stored data in the latch for output on a select output data line in the associated output data port when a port/cell select signal for the associated output port is present.

29. A memory cell for being disposed in an array of like memory cells in a multiport random access memory and selectively interfaced with data lines for a plurality of input and output data ports, and a port/cell select signal for selecting both the memory cell and the port that the memory cell is to be interfaced to, the memory cell comprising:
a current mode latch for storing two logic states in response to the presence of a holding current, the stored logic state alterable by overriding the holding current;
a current source operable to be connected to said current mode latch for providing said holding current; and
current sense circuitry associated with an output data line in each of the output data ports, said current sense circuitry operable to sense the stored data in said latch for output on the select output data line in the associated output data port when a port/cell select signal for the associated output port is present.

30. A memory cell for being disposed in an array of like memory cells in a multiport random access memory and selectively interfaced with data lines for a plurality of input and output data ports, and a port/cell select signal for selecting both the memory cell and the port that the memory cell is to be interfaced to, the memory cell comprising:
a current mode latch for storing two logic states in response to the presence of a holding current, the stored logic state alterable by overriding the holding current;
a current source operable to be connected to said current mode latch for providing said holding current; and
voltage sense circuitry associated with an output data line for sensing a potential of said output data line.

31. A memory cell for a multiport ram, comprising:
port interface circuitry for interfacing with a plurality of ports in the random access memory and having a plurality of input and output data lines, said port interface circuitry interfacing one input and one output data line for each port to the memory cell;

cell select circuitry for receiving a port/cell select signal associated with each port when both the cell an the associated port are selected;

a current mode latch for storing two logic states in the presence of a holding current, the stored logic state alterable by overriding the holding current;

current source circuitry operable to provide a source of current for the cell; and a current sense circuit associated with each interfaced output data line for operating in conjunction with said current source circuitry to sense the logic state in said current mode latch and output a drive current to said associated output data line in response to receiving an associated port/cell select signal.

* * * * *